(12) United States Patent
Varadarajan et al.

(10) Patent No.: US 7,932,736 B2
(45) Date of Patent: Apr. 26, 2011

(54) INTEGRATED CIRCUIT WITH IMPROVED TEST CAPABILITY VIA REDUCED PIN COUNT

(75) Inventors: Srinivas Varadarajan, San Diego, CA (US); Michael Laisne, San Diego, CA (US); Raghunath R. Bhattagiri, Bangalore (IN); Arvid G. Sammuli, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/704,717

(22) Filed: Feb. 12, 2010

(65) Prior Publication Data

US 2010/0141286 A1    Jun. 10, 2010

Related U.S. Application Data

(63) Continuation of application No. 11/395,392, filed on Mar. 30, 2006, now Pat. No. 7,750,660.

(51) Int. Cl.
    *G01R 31/3187* (2006.01)
(52) U.S. Cl. ................. 324/750.3; 324/754.01
(58) Field of Classification Search ........... 324/535–765
    See application file for complete search history.

(56) References Cited

U.S. PATENT DOCUMENTS

| | | | |
|---|---|---|---|
| 3,974,443 | A | 8/1976 | Thomas |
| 4,347,479 | A | 8/1982 | Cullet |
| 4,918,377 | A | 4/1990 | Buehler et al. |
| 5,347,086 | A | 9/1994 | Potter et al. |
| 5,446,395 | A | 8/1995 | Goto |
| 6,310,487 | B1 | 10/2001 | Yokomizo |
| 6,380,729 | B1 | 4/2002 | Smith |
| 6,414,498 | B2 | 7/2002 | Chen |
| 6,564,986 | B1 | 5/2003 | Hsieh |
| 6,590,225 | B2* | 7/2003 | Whetsel et al. ............ 257/48 |
| 6,646,460 | B2 | 11/2003 | Whetsel |
| 6,724,209 | B1 | 4/2004 | Whitten et al. |
| 6,727,722 | B2 | 4/2004 | Whetsel |
| 6,760,874 | B2 | 7/2004 | Cote et al. |
| 6,873,163 | B2 | 3/2005 | Bonnell et al. |
| 6,894,524 | B1 | 5/2005 | Grilletto |
| 7,002,364 | B2 | 2/2006 | Kang et al. |
| 7,061,256 | B2 | 6/2006 | Hasegawa |

(Continued)

OTHER PUBLICATIONS

International Search Report—PCT/US2007/065711, International Searching Authority—European Patent Office—Sep. 24, 2007.
Written Opinion—PCT/US2007/065711, International Searching Authority—European Patent Office—Sep. 24, 2007.

(Continued)

*Primary Examiner* — Ha Tran T Nguyen
*Assistant Examiner* — Richard Isla Rodas
(74) *Attorney, Agent, or Firm* — Jiayu Xu (57) ABSTRACT

An integrated circuit that supports testing of multiple pads via a subset of these pads includes at least two sections. Each section has multiple pads and multiple test access circuits coupled to these pads. For each section, one pad is designated as a primary pad and the remaining pads are designated as secondary pads. For each section, the test access circuits couple the secondary pads to the primary pad such that all of the pads in the section can be tested by probing just the primary pad. Each test access circuit may be implemented with a simple switch. A controller generates a set of control signals for the test access circuits in all sections. These control signals enable and disable the test access circuits such that all of the sections can be tested in parallel, and the pads in each section can be tested in a sequential order.

9 Claims, 6 Drawing Sheets

U.S. PATENT DOCUMENTS

| | | |
|---|---|---|
| 7,102,372 B2 | 9/2006 | Kuo |
| 7,106,073 B1 | 9/2006 | Bach et al. |
| 7,304,492 B2 | 12/2007 | Shiau et al. |
| 7,365,556 B2 * | 4/2008 | Cano et al. ................. 324/750.3 |
| 7,612,574 B2 * | 11/2009 | Fujiwara et al. ............. 324/763 |
| 7,772,833 B2 * | 8/2010 | Vijayaraghavan et al. 324/750.3 |
| 2003/0098859 A1 * | 5/2003 | Udo et al. ..................... 345/204 |
| 2003/0102878 A1 | 6/2003 | Montoya |
| 2004/0017217 A1 * | 1/2004 | Ryu et al. ...................... 324/763 |
| 2008/0290341 A1 * | 11/2008 | Shibata ........................... 257/48 |
| 2010/0013510 A1 * | 1/2010 | Fujiwara et al. ............. 324/763 |

OTHER PUBLICATIONS

International Search Report—PCT/US2007/065673, International Searching Authority—European Patent Office—Oct. 9, 2007.

Written Opinion—PCT/US2007/065673, International Searching Authority—European Patent Office—Oct. 9, 2007.

International Search Report—PCT/US2007/065676, International Searching Authority—European Patent Office—Oct. 9, 2007.

Written Opinion—PCT/US2007/065676, International Searching Authority—European Patent Office—Oct. 9, 2007.

\* cited by examiner

INTEGRATED CIRCUIT WITH IMPROVED TEST CAPABILITY VIA REDUCED PIN COUNT

CLAIM OF PRIORITY UNDER 35 U.S.C. §120

The present Application for Patent is a continuation of and claims priority to patent application Ser. No. 11/395,392 filed Mar. 30, 2006, currently pending, and is assigned to the assignee hereof and hereby expressly incorporated by reference herein.

BACKGROUND

I. Field

The present disclosure relates generally to electronics, and more specifically to techniques for testing an integrated circuit.

II. Background

Continual improvement in integrated circuit (IC) fabrication technology has enabled more and more complicated integrated circuits to be fabricated for a variety of applications. For example, an application specific integrated circuit (ASIC) may include one or more processors, memories, and other processing units. The integration of all of these circuit blocks on a single integrated circuit reduces cost and improves reliability.

Integrated circuits are typically manufactured via a complicated fabrication and testing process. After fabrication, the integrated circuit devices (or IC dies) are typically tested at the wafer level. Devices that pass wafer test are then packaged and tested at the final or package level. Devices that fail either wafer or final test are rejected.

Manufacturing resources are expended to package and final test each device that passes wafer test. Hence, it is desirable to identify as many defective devices as possible during the wafer test so that these devices are not unnecessarily packaged and final tested. To achieve this, a series of tests is typically performed at the wafer level. These tests often include a direct current (DC) leakage test that checks the pads on each device to make sure that these pads are not shorted or opened.

Wafer testing adds cost to the manufacturing process. Hence, a low-cost wafer probe scheme may be utilized, and this scheme may perform only a limited number of tests at the wafer level. The remaining tests (e.g., the pad DC leakage test) may be skipped at the wafer level and deferred until the package level. Each wafer level test that is deferred potentially results in defective devices (or test escapes) passing the wafer level testing. These defective devices would then be packaged and final tested, and unnecessary costs would be incurred to package and final test these defective devices.

There is therefore a need in the art for techniques to test an integrated circuit in a cost effective manner.

SUMMARY

Integrated circuits that support testing of multiple pads via a subset of these pads are described herein. This enhanced test capability allows for efficient testing at the wafer level, which can improve yield and lower manufacturing cost.

In an embodiment, an integrated circuit includes at least two sections. Each section has multiple pads and multiple test access circuits coupled to these pads. For each section, one pad is designated as a primary pad and the remaining pads are designated as secondary pads. For each section, the test access circuits electrically couple the secondary pads to the primary pad such that all of the pads in the section can be tested by probing just the primary pad. Each test access circuit may be implemented with a simple switch. A controller generates a set of control signals for all sections. These control signals enable and disable the test access circuits such that all of the sections can be tested in parallel, and the pads in each section can be tested in a sequential order. For example, if the integrated circuit has K sections and each section has N pads, then all K×N pads on the integrated circuit may be tested in N iterations, with a different set of K pads in the K sections being tested in each iteration.

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

Figure 1:
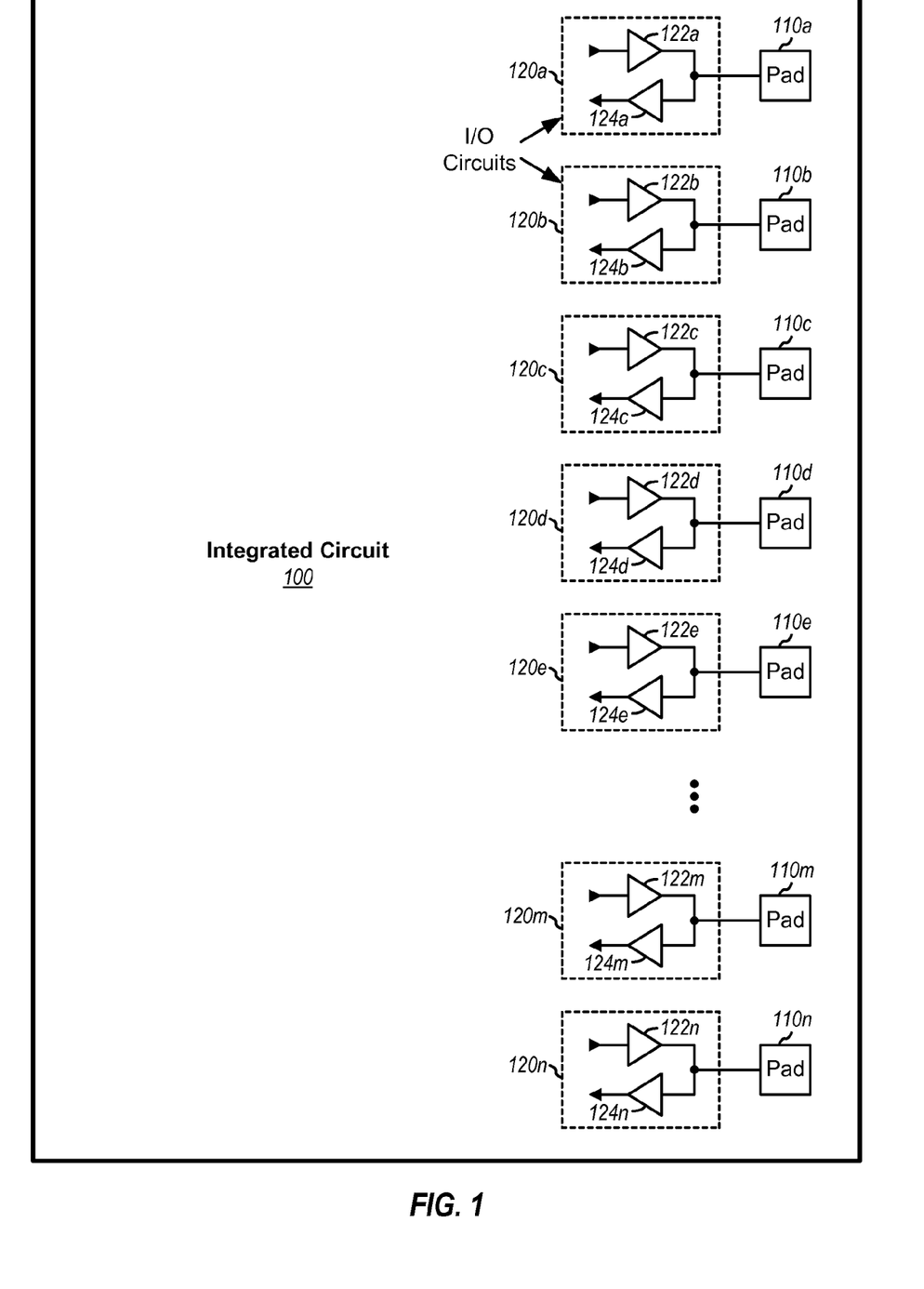
FIG. 1 shows a conventional integrated circuit.

FIG. 1 shows an embodiment of an integrated circuit 100 with multiple (N) input/output (I/O) pads 110a through 110n. Pads 110 may be located anywhere on an IC die and may even be underneath the die. Each pad 110 provides interconnection to circuitry internal to integrated circuit 100. Each pad 110 is associated with an I/O circuit 120 that provides signal drive and buffering for that pad. Within each I/O circuit 120, an output buffer 122 provides signal drive for an output signal being sent from the pad, and an input buffer 124 provides buffering for an input signal being received via the pad. Each pad 110 may be electrically coupled to an external pin of an IC package via a bond wire, a lead frame finger, and so on (not shown in FIG. 1). A pad may also be electrically coupled to another pad on another integrated circuit that may be mounted either on top of or side-by-side with integrated circuit 100. For simplicity, FIG. 1 shows a column of pads 110 for only one side of integrated circuit 100. The other sides of integrated circuit 100 may also have pads. Furthermore, integrated circuit 100 may include bumps, which are metallization over contact areas.

An integrated circuit device is often tested at both the wafer level (while the device is a die on a wafer) and the package level (after the device has been assembled inside an IC package). In general, an integrated circuit may be tested at various stages of an assembly process including inter-die testing prior to sawing and testing an array of pads or under-bump metallization on the top or bottom of a die. Thorough testing of the device may require access to all of the testable pads on the device. For example, each pad may be tested for DC leakage to ensure that the pad is not shorted or opened. This may be achieved by (1) applying a test voltage to the pad and measuring the current flowing through the pad or (2) forcing a current and measuring the voltage. ESD diodes may also be measured with a power supply on a test controller. In general, for DC testing, a Parametric/Precision Measurement Unit (PMU) may be used to (1) force a voltage on a pad and measure the current flowing through the pad or (2) force a current through the pad and measure the voltage on the pad.

The DC tests and/or slow alternating current (AC) tests may be performed at the wafer level and/or the package level. The DC tests may include DC leakage test as well as other tests. It is desirable to perform the DC tests and/or slow AC tests at the wafer level in order to avoid packaging and testing defective devices, e.g., with opened and/or shorted pads. However, individually probing each pad on each device for the DC tests and/or slow AC tests at the wafer level can extend test time and increase manufacturing cost.

Figure 2:
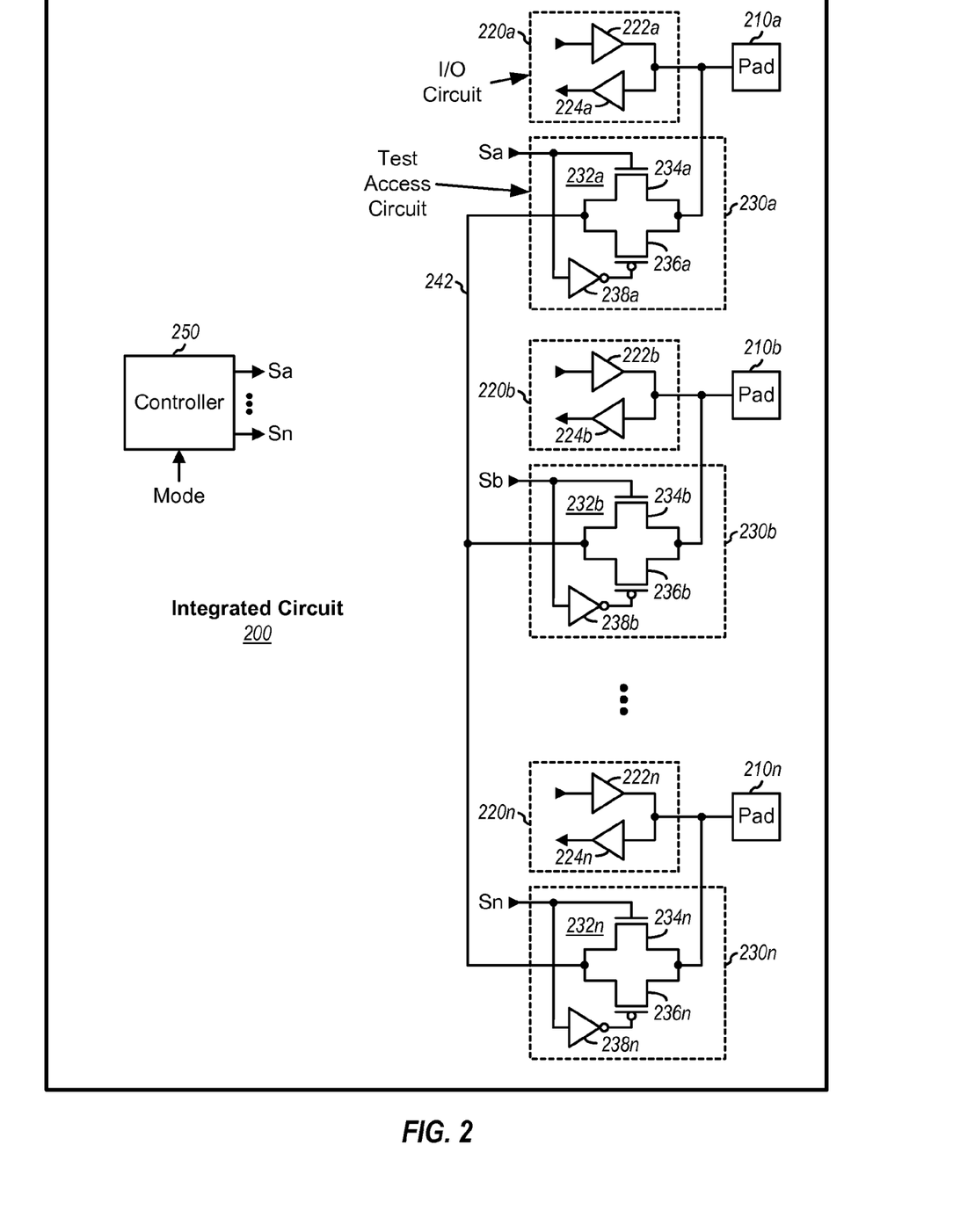
FIG. 2 shows an integrated circuit that supports testing of multiple pads via a single pad.

FIG. 2 shows an embodiment of an integrated circuit 200 that supports testing of multiple pads via a single pad. Integrated circuit 200 includes multiple (N) pads 210a through 210n, multiple (N) I/O circuits 220a through 220n, and multiple (N) test access circuits 230a through 230n. Each pad 210 couples to a respective I/O circuit 220 and further to a respective test access circuit 230. In the embodiment shown in FIG. 2, each I/O circuit 220 includes an output buffer 222 that provides signal drive for the associated pad 210 and an input buffer 224 that provides input buffering for the pad. Each test access circuit 230 provides access to the associated pad 210 for testing purposes. In general, a pad may be coupled to an input buffer or an output buffer, or both input and output buffers. A pad may also be associated with pull-ups, pull-downs, and/or keepers, which may also be tested via the associated test access circuit.

In the embodiment shown in FIG. 2, test access circuit 230a includes a switch 232a and an inverter 238a. Switch 232a is formed with an N-channel field effect transistor (N-FET) 234a and a P-channel FET (P-FET) 236a. The sources of N-FET 234a and P-FET 236a are coupled together and further to the associated pad 210a. The drains of N-FET 234a and P-FET 236a are coupled together and further to a common node or connection 242. Inverter 238a has its input coupled to the gate of N-FET 234a and its output coupled to the gate of P-FET 236a. The gate of N-FET 234a is driven by an Sa control signal, and the gate of P-FET 236a is driven by an inverted Sa control signal from inverter 238a. Switch 232a is either closed or opened by the Sa control signal. Inverter 238a may also drive N-FET 234a instead of P-FET 236a. Test access circuit 230a may also be implemented in other manners.

Test access circuits 230b through 230n are each coupled in the same manner as test access circuit 230a. Switches 232a through 232n within test access circuits 230a through 230n, respectively, have one end coupled to common node 242 and the other end coupled to pads 210a through 210n, respectively.

A controller 250 generates the Sa through Sn control signals for switches 232a through 232n within test access circuits 230a through 230n, respectively. Controller 250 may receive a Mode signal that indicates whether integrated circuit 200 is operating in a test mode. In the test mode, controller 250 generates the control signals in a manner to enable testing of all of the pads.

The structure shown in FIG. 2 allows pads 210a through 210n to be tested by probing a single pad. The pad on which a test probe is applied is called a primary pad. The remaining pads that are not directly probed are called secondary pads. For clarity, the following description assumes that pad 210a is the primary pad, and pad 210b through 210n are secondary pads.

For DC testing (e.g., DC leakage testing), integrated circuit 200 is placed in the test mode, and a test probe is applied to primary pad 210a. To test I/O circuit 220a for primary pad 210, switches 232a through 232n are turned off by bringing the Sa through Sn control signals to logic low. Pad 210a may then be tested in the normal manner since pads 210b through 210n are disconnected from pad 210a with switches 232a through 232n turned off. If pad 210a is defective (e.g., opened or shorted), then the DC leakage test terminates and the IC device is rejected. Otherwise, if pad 210a is non-defective, then the remaining pads 210b through 210n may be tested one at a time.

To test a secondary pad 210y, where y∈{b, c, . . . , n}, switch 232a is turned on by bringing the Sa control signal to logic high, switch 232y is turned on by bringing the Sy control signal to logic high, and all other switches 232 are turned off by bringing their control signals to logic low. The test signal is applied to primary pad 210a by the test probe, routed via switches 232a and 232y, and provided to pad 210y. Since pad 210a is known to be non-defective, only pad 210y is effectively tested.

Primary pad 210a may be tested directly in the normal manner. Secondary pads 210b through 210n may be individually tested via test access circuit 230a in combination with test access circuits 230b through 230n, respectively. Test access circuits 230a through 230n are circuitry that connects the pad being probed by the test probe (primary pad 210a) to the pad being tested (secondary pad 210y, where y∈{b, c, . . . n}).

FIG. 2 shows a specific embodiment for interconnecting the test access circuits for testing the pads on the integrated circuit. This embodiment uses a "star" configuration with common node 242 being the center of the star, pads 210a through 210n being the end points of the star, and each pad being coupled to the center node via the associated test access circuit. In another embodiment, the test access circuits are coupled in a "daisy chain" configuration. For this configuration, each test access circuit couples between a different pair of pads. For example, test access circuit 230a may be coupled between pads 210a and 210b, test access circuit 210b may be coupled between pads 210b and 210c, and so on, and test access circuit 210m may be coupled between pads 210m and 210n. Each pad receives the test signal via a preceding test access circuit and/or provides the test signal via a subsequent test access circuit. All test access circuits are disabled to test primary pad 210, test access circuit 230a is enabled to test secondary pad 210b, test access circuits 230a and 230b are enabled to test secondary pad 210c, and so on. A combination of "star" and "daisy chain" circuits may also be used on the same integrated circuit. Simulation, characterization, and/or other forms of circuit analysis may be used to determine and assign parametric offsets. These parametric offsets may be used to increase the accuracy of the measurements for either the "star" or "daisy chain" configuration. For clarity, the star configuration is used for much of the description herein.

Figure 3:
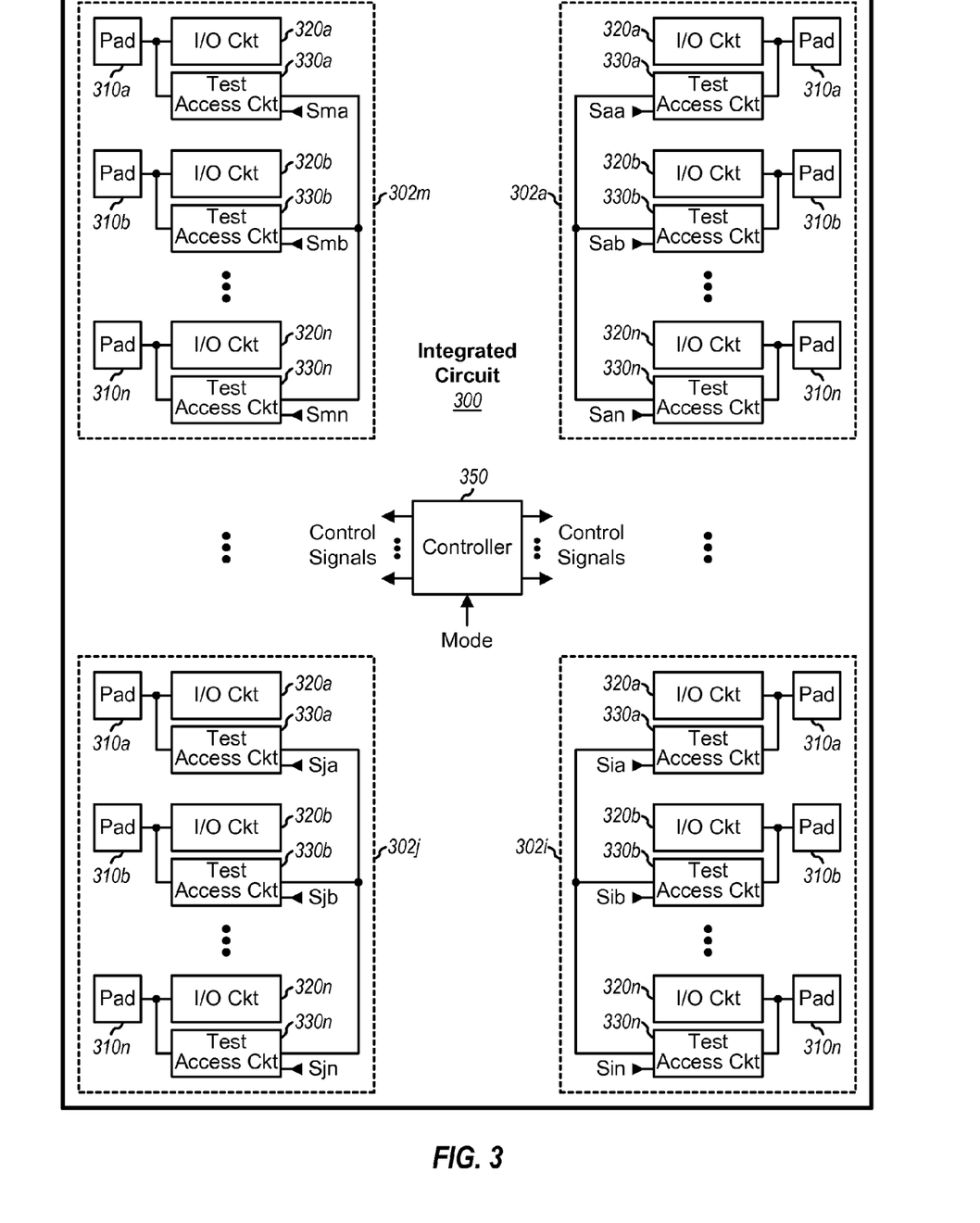
FIG. 3 shows an integrated circuit with multiple pad sections.

FIG. 3 shows an embodiment of an integrated circuit 300 that supports testing of multiple pads using a subset of these pads. Within integrated circuit 300, the pads are arranged in multiple (M) sections 302a through 302m. Each section 302 includes multiple (N) pads 310a through 310n, multiple (N) I/O circuits 320a through 320n, and multiple (N) test access circuits (ckts) 330a through 330n, one test access circuit for each pad. For each section 302, test access circuits 320a through 320n may be coupled to pads 310a through 310n in the manner described above for integrated circuit 200 in FIG. 2. For each section 302, one pad (e.g., pad 310a) is designated as the primary pad to which a test probe is applied, and the remaining pads (e.g., pads 310b through 310n) are designated as secondary pads that are not directly probed. All of the pads in each sector may be tested by probing only the primary pad for the section. A controller 350 generates the control signals to enable and disable the test access circuits in all M sections 302a through 302m. In the embodiment shown in FIG. 3, any number of pads in a group (e.g., pads 310b through 310n) may be tested simultaneously. This simultaneous testing may be useful when correlation to single pad testing is difficult to achieve with a larger group.

In general, an integrated circuit may include any number of sections, and each section may include any number of pads. The sections may include the same or different numbers of pads. Each section includes one primary pad, where any pad in the section may be designated as the primary pad. The primary pads for all of the sections may be selected based on various criteria such as, e.g., layout considerations, testing considerations, and so on. For example, pads on one side of the integrated circuit may be more accessible, and these pads may be selected as the primary pads. As another example, other tests may be performed on some I/O circuits or pads, and these pads would not be selected as the primary pads.

For integrated circuit 300, the M sections 302a through 302m may be tested in parallel by applying M test probes to the M primary pads for the M sections. One test probe may be applied to the primary pad (e.g., pad 310a) for each section and used to sequentially test all of the pads in that section. The pads in each section may be tested as described above for FIG. 2. The control signals for each section are appropriately set to enable testing of each pad. M may be a small subset of all of the pads on the integrated circuit. In this case, wafer testing may be performed with a reduced number of test probes, which may substantially reduce test cost. The parallel testing of the M sections can reduce test time.

Figure 4:
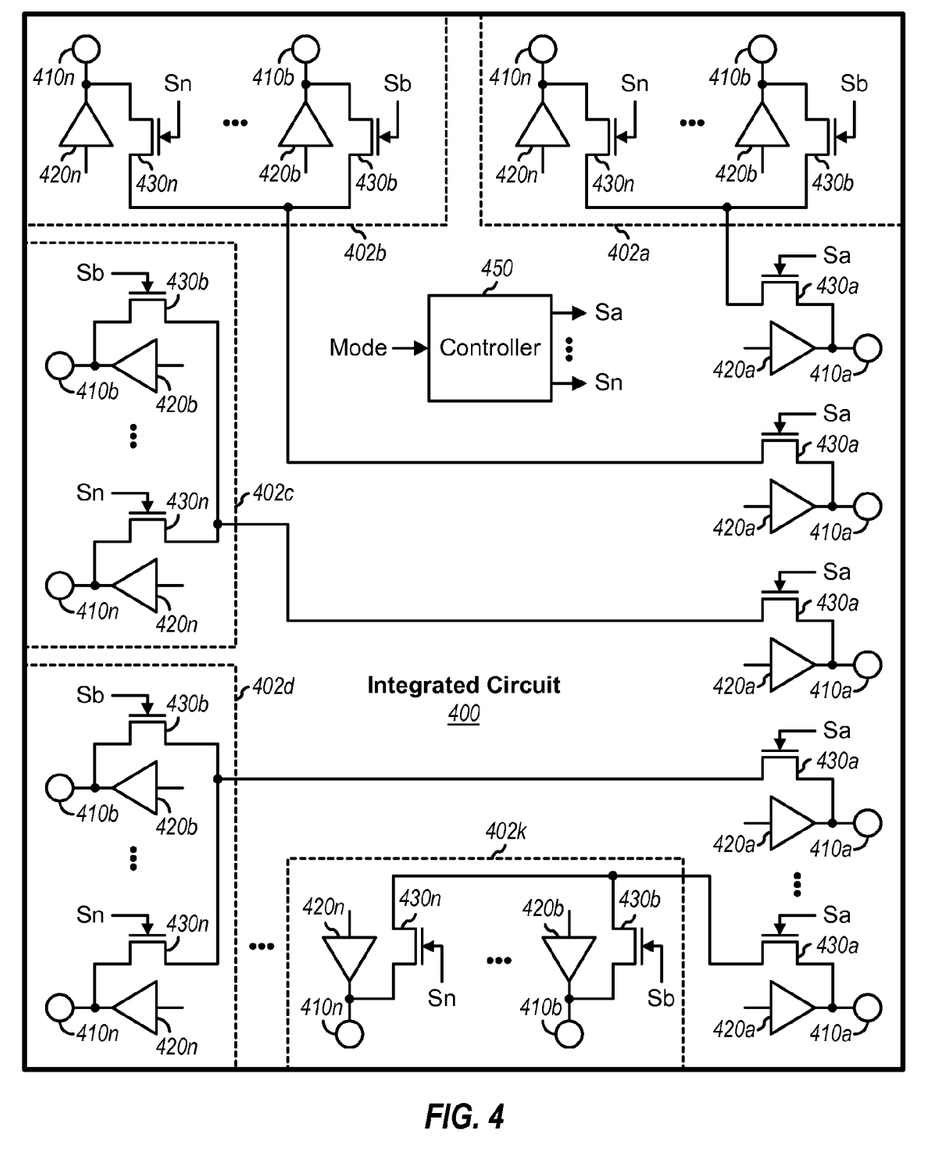
FIG. 4 shows an integrated circuit that supports testing of all testable pads using a small subset of these pads.

FIG. 4 shows an embodiment of an integrated circuit 400 that supports testing of all testable pads using a subset of these pads. Integrated circuit 400 includes multiple (K) sections 402a through 402k. Each section 402 includes multiple (N) pads 410a through 410n, multiple (N) I/O circuits that are represented by buffers 420a through 420n, and multiple (N) test access circuits that are represented by N-FETs 430a through 430n, one N-FET for each pad. For simplicity, each section 402 is represented by a dashed box that includes all pads, buffers, and N-FETs for that section except for pad 410a, buffer 420a, and N-FET 430a. For each section 402, N-FETs 430a through 430n have their sources coupled to pads 410a through 410n, respectively, their gates receiving the Sa through Sn control signals, respectively, and their drains coupled to a common node or connection. For each section 402, pad 410a is designated as the primary pad to which a test probe is applied in order to test pads 410a through 410n in that section.

For the embodiment shown in FIG. 4, the same set of Sa through Sn control signals is used for all K sections 402a through 402k. The Sa control signal is coupled to N-FETs 430a in all K sections, the Sb control signal is coupled to N-FETs 430b in all K sections, and so on, and the Sn control signal is coupled to N-FETs 430n in all K sections. A controller 450 generates the Sa through Sn control signals for the N-FETs.

Table 1 shows an exemplary test sequence for testing the pads within integrated circuit 400. In step 1, all K control signals Sa through Sn are at logic low (or Off), all N-FETs 430 are turned off, and I/O circuits 420a in all K sections are tested via pads 430a. In step 2, the Sa and Sb control signals are at logic high (or On), the Sc through Sn control signals are at logic low, N-FETs 430a and 430b are turned on and N-FETs 430c through 430n are turned off in all K sections, and I/O circuits 420b in all K sections are tested via pads 430a and 430b. In step 3, the Sa and Sc control signals are at logic high, the Sb and Sd through Sn control signals are at logic low, N-FETs 430a and 430c are turned on and N-FETs 430b and 430d through 430n are turned off in all K sections, and I/O circuits 420c in all K sections are tested via pads 430a and 430c. The remaining I/O circuits are tested in similar manner.

TABLE 1

| Step | On | Off | Description |
| --- | --- | --- | --- |
| 1 |  | Sa to Sn | Test pad 410a and I/O circuit 420a via pad 430a. |
| 2 | Sa and Sb | Sc to Sn | Test pad 410b and I/O circuit 420b via pads 430a and 430b. |
| 3 | Sa and Sc | Sb and Sd to Sn | Test pad 410c and I/O circuit 420c via pads 430a and 430c. |
| . | . | . | . |
| . | . | . | . |
| . | . | . | . |
| N | Sa and Sn | Sb to Sm | Test pad 410n and I/O circuit 420n via pads 430a and 430n. |

For the embodiment shown in FIG. 4, K pads and K I/O circuits in the K sections are tested in parallel via the K primary pads and the K secondary pads for these I/O circuits. All pads and I/O circuits may be tested in N iterations.

In certain instances, only some of the pads on an integrated circuit may be accessible for testing. For example, an IC device may be mounted on top of another IC device in a stacked die configuration, and only a portion of the IC device on the bottom may be accessible for testing. In this case, the primary pads may be selected based on accessibility. For the embodiment shown in FIG. 4, only the pads on the right side of integrated circuit 400 may be accessible. These pads may then be used to test other pads located in other parts of the integrated circuit.

FIGS. 2 through 4 show several embodiments of integrated circuits that support testing of multiple pads via a subset of these pads. FIGS. 2 through 4 also show specific embodiments for interconnecting the pads for testing. The pads may also be interconnected in other manners and using other types of test access circuits.

Figure 5:
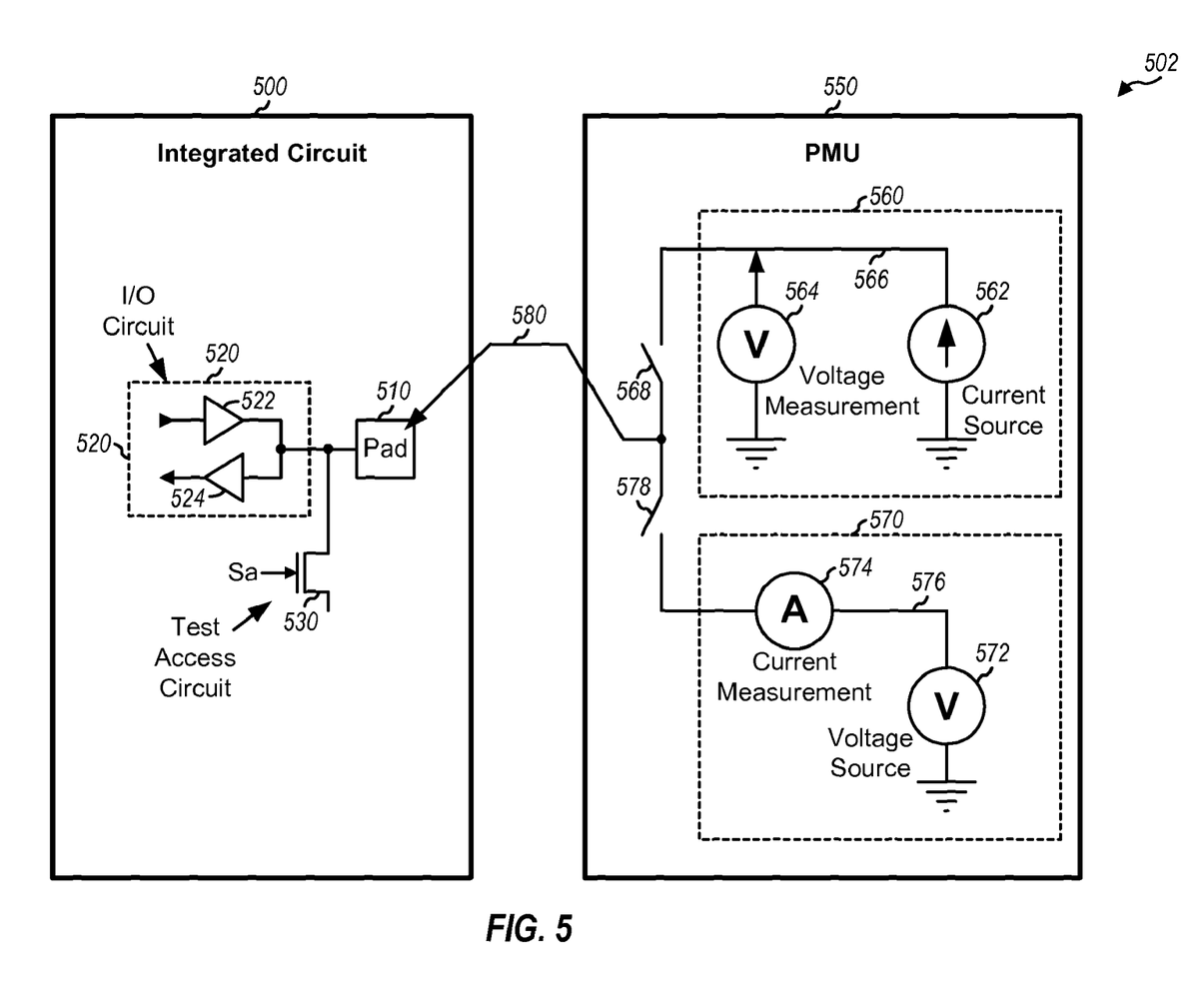
FIG. 5 shows a configuration for testing an integrated circuit.

FIG. 5 shows an embodiment of a test configuration 502 for testing the pads and I/O circuits within an integrated circuit 500. For clarity, only one pad 510, one I/O circuit 520, and one test access circuit 530 are shown for integrated circuit 500. Test configuration 502 includes a Parametric/Precision Measurement Unit (PMU) 550 having two test sections 560 and 570. Section 560 includes a current source 562 that generates and provides a programmable current via a line 566 and a voltage measurement unit 564 that measures the voltage on line 566. Section 570 includes a voltage source 572 that generates and provides a programmable voltage via a line 576 and a current measurement unit 574 that measures the current flowing through line 576. A switch 568 couples test section 560 to a test probe 580, and a switch 578 couples test section 570 to the test probe. PMU 550 may be coupled to pad 510 via test probe 580.

Test configuration 502 in FIG. 5 may be used for various DC parametric tests such as, for example, DC leakage test, input level test, output level test, keeper strength test, pull-up/pull-down strength test, and so on. For the DC leakage test, test section 570 is enabled and applies a voltage (a high voltage $V_{DD}$ or a low voltage $V_{SS}$) to pad 510. Current measurement unit 574 then measures the current flowing through pad 510 for the applied voltage level. For the input level test, test section 570 is enabled and applies different voltages (e.g., voltages that increase in small increments) to pad 510, and the output of I/O circuit 520 is monitored to determine (1) the minimum input voltage ($VIH_{min}$) that is recognized as logic high by integrated circuit 500 and (2) the maximum input voltage ($VIL_{max}$) that is recognized as logic low by integrated circuit 500. For the output level test, I/O circuit 520 is configured to output logic low (or logic high), test section 560 is enabled, current source 562 is configured to sink (or source) a specified amount of current, and voltage measurement unit 564 measures the output voltage for logic low (or logic high). The keeper strength test measures the amount of current needed to change the state of an I/O circuit whose value is retained by a keeper. The pull-up/pull-down strength test measures the current when logic low or high is applied on a pad that is pulled to a particular state.

DC tests may be performed on multiple pads via a subset of these pads, e.g., using test configuration 502 in FIG. 5. Alternating current (AC) tests may also be performed on multiple pads via a subset of these pads. The test access circuits may be controlled such that only one I/O circuit in each section is AC tested via the primary pad and possibly a secondary pad at any given moment. The AC testing may be performed in a manner (e.g., at a lower signal frequency or a slower clock rate) to account for parasitic capacitance and/or resistance that may result from long path lengths of inter-pad connections, routes, and nets due to the test signal being applied via multiple pads to the I/O circuit under test. A signal may also be broadcast from the probed pad and captured at input receiver registers of multiple pads in a group.

The test capability described herein may be used for various types of integrated circuits such as, for example, an ASIC, a digital signal processor (DSP), a reduced instruction set computer (RISC), a digital signal processing device (DSPD), a programmable logic device (PLD), a field programmable gate array (FPGA), a processor, a controller, a micro-controller, a microprocessor, a memory device, and so on. The memory device may be a random access memory (RAM), a static RAM (SRAM), a dynamic RAM (DRAM), a synchronous DRAM (SDRAM), a read only memory (ROM), a Flash memory, and so. The integrated circuit and test capability may be used for various applications such as communication, networking, computing, consumer electronics, and so on.

Figure 6:
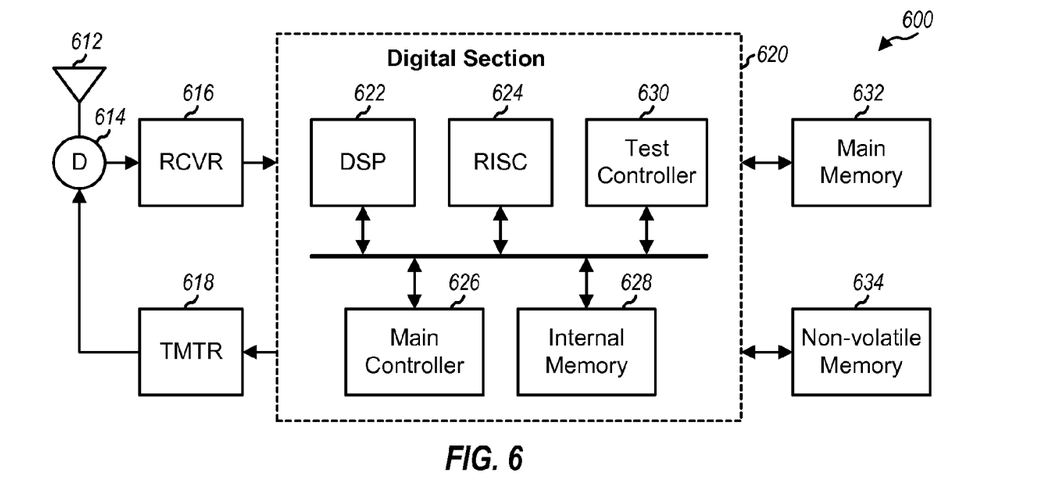
FIG. 6 shows a block diagram of a wireless device.

FIG. 6 shows a block diagram of a wireless device 600 that includes one or more integrated circuits having the test capability described herein. Wireless device 600 may be a cellular phone, a terminal, a handset, or some other apparatus. Wireless device 600 may be capable of communicating with a Code Division Multiple Access (CDMA) system, a Time Division Multiple Access (TDMA) system, a Global System for Mobile Communications (GSM) system, an Advanced Mobile Phone System (AMPS) system, a wireless local area network (WLAN), and so on. A CDMA system may implement Wideband-CDMA (W-CDMA), cdma2000, or some other radio access technology.

Wireless device 600 provides bi-directional communication via a receive path and a transmit path. For the receive path, forward link signals transmitted by base stations are received by an antenna 612, routed through a duplexer (D) 614, and provided to a receiver unit (RCVR) 616. Receiver unit 616 conditions and digitizes the received signal and provides input samples to a digital section 620 for further processing. For the transmit path, a transmitter unit (TMTR) 618 receives from digital section 620 data to be transmitted, processes and conditions the data, and generates a reverse link signal, which is routed through duplexer 614 and transmitted via antenna 612 to the base stations.

Digital section 620 includes various processing units and support circuitry such as, for example, a DSP 622, a RISC 624, a main controller 626, an internal memory 628, and a test controller 630. DSP 622 and/or RISC 624 may implement a modem processor, a video processor, a graphics processor, and/or other processors for other applications. Main controller 626 directs the operation of various units in wireless device 600. Internal memory 628 stores program codes and/or data used by various units within digital section 620. Test controller 630 facilitates testing of digital section 620 and may implement any of the testing techniques described above. A main memory 632 provides mass storage for wireless device 600 and may be a RAM, an SRAM, a DRAM, an SDRAM, and so on. A non-volatile memory 634 provides non-volatile storage and may be a Flash memory, a ROM, and so on.

Digital section 620 may be implemented as an ASIC. Memories 632 and 634 may be implemented as memory ICs that are external to the ASIC. The ASIC and/or memory ICs may be designed with the test capability described herein.

The integrated circuits described herein may be implemented with various IC process technologies such as complementary metal oxide semiconductor (CMOS), N-channel MOS (N-MOS), P-channel MOS (P-MOS), bipolar-CMOS (Bi-CMOS), and so on. CMOS technology can fabricate both N-FET and P-FET devices on the same die, whereas N-MOS technology can only fabricate N-FET devices and P-MOS technology can only fabricate P-FET devices. The testing techniques described herein may be used in any technology. The switches described herein may be implemented using any device associated with a switch in a given technology. The devices may include but are not limited to a CMOS pass gate, an N-FET, a P-FET, a fuse, and so on.

Figure 7:
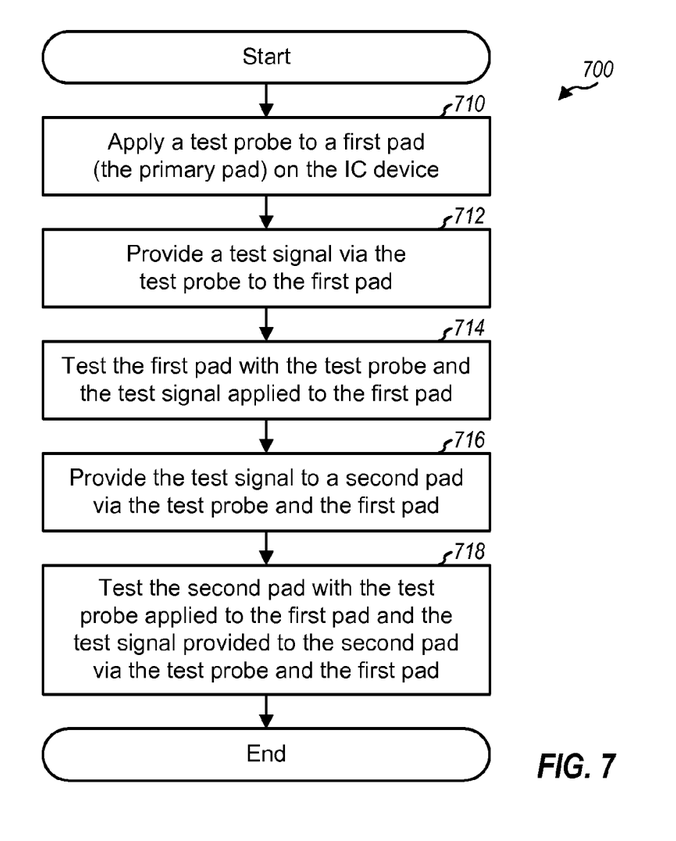
FIG. 7 shows a process for testing an IC device.

FIG. 7 shows a process 700 for testing multiple pads on an IC device by probing a single pad on the IC device. A test probe is applied to a first pad (the primary pad) on the IC device (block 710). A test signal is provided via the test probe to the first pad (block 712). The first pad is tested with the test probe and the test signal applied to the first pad (block 714). A voltage may be provided via the test probe to the first pad, and the current flowing through the first pad may be measured with the test probe. Alternatively, a current may be provided via the test probe to the first pad, and the voltage at the first pad may be measured with the test probe. Other tests with other test signals may also be performed.

The test signal is then provided to a second pad via the test probe and the first pad (block 716). The second pad is then tested with the test probe applied to the first pad and the test signal provided to the second pad via the test probe and the first pad (block 718). Each remaining pad may be tested by repeating blocks 716 and 718. For each pad to be tested, the test access circuits are appropriately enabled and disabled so that the pad under test is electrically coupled to the test probe that is applied to the first pad.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An integrated circuit comprising:
   a plurality of input/output (I/O) circuits;
   a plurality of pads, each pad coupled to a corresponding one of the plurality of I/O circuits;
   a plurality of test access circuits each coupled to a corresponding one of the plurality of pads and to a corresponding one of the plurality of I/O circuits;
   a common connection node coupled to each of the plurality of test access circuits, wherein the common connection node, plurality of test access circuits and plurality of pads are configured so there is a test access circuit between each pad and the common connection node, and two access circuits and the common connection node between each one of the plurality of pads and every other one of the plurality of pads; and
   a controller coupled to each of the plurality of test access circuits, the controller configured to send control signals to each of the plurality of test access circuits to selectively enable one or more of the test access circuits,
   wherein the controller is configured to generate the control signals in a manner that individually enables test access circuits to connect the corresponding I/O circuit to a test signal applied to one of the plurality of pads (primary pad), thereby enabling testing each of the plurality of I/O circuits by directly probing only the primary pad and not directly applying a test probe to any of the other of the plurality of pads (secondary pads).

2. The integrated circuit of claim 1, wherein the plurality of test access circuits are configured such that the primary pad is tested by a control signal from the controller disabling a test access circuit corresponding to the primary pad.

3. The integrated circuit of claim 2, wherein the plurality of test access circuits are further configured such that each secondary pad is tested by control signals from the controller enabling the one of the plurality of test access circuits corresponding to the primary pad, enabling the one of the plurality of test access circuits corresponding to the secondary pad being tested, and disabling all other test access circuits.

4. The integrated circuit of claim 2, wherein each test access circuit among the plurality of test access circuits comprises a switch coupled between the common connection node and the corresponding one of the plurality of pads associated with the test access circuit.

5. The integrated circuit of claim 4, wherein the switch of each test access circuit comprises at least one field effect transistor (FET).

6. The integrated circuit of claim 1, wherein the primary pad is further configured to receive a test signal for direct current (DC) testing or slow alternating current (AC) testing of the plurality of pads.

7. The integrated circuit of claim 1, wherein the controller is operative to generate the control signals to test the plurality of pads in a sequential order.

8. The integrated circuit of claim 1, wherein the plurality of test access circuits are fabricated with complementary metal oxide semiconductor (CMOS).

9. An integrated circuit comprising:
   at least two sections, each section comprising:
      a plurality of input/output (I/O) circuits;
      a plurality of pads, each pad coupled to a corresponding one of the plurality of I/O circuits;
      a plurality of test access circuits each coupled to a corresponding one of the plurality of pads and to a corresponding one of the plurality of I/O circuits;
      a common connection node coupled to each of the plurality of test access circuits, wherein the common connection node, plurality of test access circuits and plurality of pads are configured so there is a test access circuit between each pad and the common connection node, and two access circuits and the common connection node between each one of the plurality of pads and every other one of the plurality of pads; and
   a controller coupled to each section and to each of the plurality of test access circuits, the controller configured to send control signals to each of the plurality of test access circuits to selectively enable one or more of the test access circuits,
   wherein the controller is configured to generate the control signals in a manner that individually enables test access circuits in each section to connect the corresponding I/O circuits to a test signal applied to one of the plurality of pads in each section (primary pad), thereby enabling testing each of the plurality of I/O circuits by directly probing only the primary pads and not directly applying a test probe to any of the other of the plurality of pads (secondary pads).

* * * * *